United States Patent [19]

Kramer

[11] 4,101,882
[45] Jul. 18, 1978

[54] DATA READ-OUT SYSTEM AND APPARATUS USEFUL FOR ANGULAR MEASUREMENTS

[75] Inventor: Melvin G. Kramer, Riverton, Wyo.

[73] Assignee: The Brunton Company, Riverton, Wyo.

[21] Appl. No.: 691,078

[22] Filed: May 28, 1976

[51] Int. Cl.² .................. G08C 9/06; H03K 13/18
[52] U.S. Cl. ...................... 340/347 P; 250/231 SE
[58] Field of Search ............... 340/347 P, 347 M; 250/231 SE, 566

[56] References Cited

U.S. PATENT DOCUMENTS

| | | | |
|---|---|---|---|
| 3,244,895 | 4/1966 | Anderegg | 250/237 X |
| 3,531,798 | 9/1970 | Dureau | 340/347 P |
| 3,560,959 | 2/1971 | Bergey | 340/347 DD |
| 3,713,139 | 1/1973 | Sanford et al. | 340/347 P |
| 3,728,715 | 4/1973 | Shapiro | 340/347 P |
| 3,772,503 | 11/1973 | Fowler | 340/347 DD X |
| 3,824,587 | 7/1974 | Fowler | 340/347 P |
| 3,833,901 | 9/1974 | Fowler | 340/347 P |

Primary Examiner—Thomas J. Sloyan
Attorney, Agent, or Firm—John E. Reilly

[57] ABSTRACT

Data acquired from a source such as a coded disc is processed so as to be free of ambiguities associated with boundary transitions where the data source produces groups of bits which have least significant ordering and higher significant ordering. Wherever a common transition boundary between the bit groups occurs, ambiguities from misalignment of these boundaries are avoided by controlling the higher ordered bit transitions from the lower ordered bit transitions. Circuitry tracks and stores the higher order bits by synchronous updating whenever no misalignment or skew sensitive transitions are encountered. Logic circuitry continuously inspects the lower significant bits to determine the presence or absence of a zone surrounding the common transition boundary and also detects the actual passage and direction of the transition boundary in the lower significant bit group. This logic corrects the counter stored higher order bit counts in conformity with the status of the lower significant bit states. The system output is a composite of the lower significant digits read directly and the controlled and updated higher significant digits with appropriate code conversion. Whenever the data source is an optical coded disc or the like, the data acquired can be enhanced by an arrangement of light collimating and focusing elements relative to the coded transparent/opaque areas of the disc cell tracks.

19 Claims, 13 Drawing Figures

Fig_1

Fig_2

Fig_3

Fig. 4

NOTE: DARK AREAS INDICATE "1" AREAS OF THE CODE DISC

Fig_10

Fig_12

Fig_13

DATA READ-OUT SYSTEM AND APPARATUS USEFUL FOR ANGULAR MEASUREMENTS

CROSS REFERENCE TO RELATED APPLICATIONS

The copending application entitled ANGULAR DISPLACEMENT MEASURING APPARATUS by Melvin G. Kramer, Ser. No. 613,104, filed Sept. 15, 1975, now U.S. Pat. No. 3,999,064, and assigned to the same assignee as this application shows a digital data read-out system for avoiding boundary ambiguities by use of specially coded control tracks and monitoring logic circuitry particularly useful for compass digital read-out applications.

BACKGROUND OF THE INVENTION

This invention relates to systems and apparatus for measurement of angular displacements relative to reference lines or datum planes. More particularly, the present invention relates to devices and systems for the measurement of horizontal angular displacements, vertical angular displacements or both. One aspect of the present invention is particularly useful for control of the collimating and focusing of light passing through multiple cells of a transparent/opaque coded disc. In yet another aspect of the invention accurate digital data is produced from a source of multiple bit digit groups coded in accordance with displacements from a reference line or datum plane with the resultant digital data production being relatively free of skew or alignment ambiguities associated with boundary transitions of those data bits. The invention is particularly useful for vertical angular measurement apparatus or inclinometers as will be described in detail for the preferred embodiment but its adaptability to other applications such as digital compass environments, linear displacement measurements and the like will be readily recognized by those having normal skill in the art.

Prior art devices and systems for measuring angular displacements have taken many forms. Directly readable mechanical scales as with plumb lines and arcuate members for inclinometers, low friction mounted circular discs for compasses or transits and the like have been satisfactory for many uses. Generally such measurements have been made relative to a zero or reference level position by manually leveling the instrument by observing bubble level vials or the like mounted on the instrument. The angular orientation or displacement is then read directly by moving some member of the instrument and observing scale alignments attached to the moving member relative to the fixed level member. Such predominantly mechanical devices have been employed in a variety of applications and industries such as in mining, road building, construction, military weaponry and so forth. For instance, in vertical angular control for military weaponry such as artillary pieces, the desired vertical angle of the barrel or tube is manually set by rotating a gear arrangement until the angle is shown by a mechanical digital readout. The barrel is subsequently raised or lowered until a bubble level vial indicates the level position has been reached.

Unfortunately, the accuracy of reading of such mechanical prior art devices is substantially limited. Thus, there have been some developments towards automating the digital data read-out associated with angular orientation of displacement measurement apparatus and converting the digital data to direct displays, data processing system input formats and the like. Optical systems associated with coded transparent/opaque discs or displacement reflecting members have been increasingly popular for improving the accuracy of data read. Further, the development of electronic circuitry for handling the data obtained from such optical systems has likewise increased the popularity of converting the resultant light correlated signals to readable displays or computer compatible input signals. One example of a wrap-around optical system associated with a circular code disc is shown in U.S. Pat. No. 3,244,895 by Anderegg. However, none of the known prior art devices satisfactorily concentrate the light sources from a light emitting device so as to produce a highly focused, narrow line of light for illuminating a coded transparent/opaque cell so as to maximize the transition of the light coupling or intervention by the cell and thus improve the accuracy of the optical read-out.

Various electronic systems have been developed for the purpose of providing digital data as an output in response to multiple bit input signals read from a code disc. It has been known that the use of the so-called excess −3 Gray code for such discs is particularly attractive since only one bit transition is encountered for each boundary between cells. Some systems for transposing the data read from such code discs are shown in U.S. Pat. Nos. 3,772,503 by Fowler and 3,833,901 by Fowler, both of which employ the disc output signals for controlling clock incremented pulse train generation to reflect the angular orientation or displacement being indicated by the disc at any given moment. A variation on such systems for accommodating angular displacement measurement or magnetic heading data by controlling the most significant digits of the disc to determine whether the conversion circuitry should be directly read or complemented is also shown to Fowler in U.S. Pat. No. 3,824,587. Other systems for electronically interpreting data such as Moire fringe pattern interpretation by incrementing up/down counters and further by parallel handling of the least and most significant digits so that the least significant digits can be preset and complemented is shown in U.S. Pat. No. 3,713,139 by Sanford et al. Yet another arrangement for parallel handling of least and most significant digits read from a code detector of sunlight angular measurement is shown in U.S. Pat. No. 3,728,715 by Shapiro.

Although not concerned with disc read-outs, U.S. Pat. No. 3,560,959 by Bergey shows a system for converting the output of an altitude encoder into a display by separate controls of the least and most significant bits. That is, systems such as that of Bergey use ripple counters for comparison against the encoder output for the more significant digits and logically interpret the least significant digits to determine both the status of a direct display of these least significant digits and also the direction of counting for the more significant digits.

Despite the popularity of transparent/opaque coded cells of discs and optical systems for use therewith and the application of electronic circuitry to convert the data acquired from such discs to an appropriate read-out, none of the prior art devices effectively overcome skewing or transition boundary misalignments of such discs or data sources or multiple bit groups having different data significance. As a practical matter, such misalignment or skew problems become increasingly critical as the width of the coded track narrows to accommodate the requirements for increasingly accurate angular measurement or displacement measurement.

Prior efforts such as that disclosed in the U.S. Pat. No. 3,999,064 cross-referenced above are effective for somewhat reducing this misalignment problem by controlled sampling as near as possible to the center of the cells of the track. In addition, the increased number of bits that must be read from a given track and the physical constraints of the disc manufacture as well as the prospect of warpage or component misalignment during normal usage renders it difficult to obtain accurately read data from such tracks. The increasing of the diameter of the coded disc can partially overcome such limitations but again encounters practical limitations as to physical size for many applications. The use of sophisticated circuitry for cell center sampling is likewise undesirable both for manufacturing costs and for the reliability of usage in the field.

SUMMARY OF THE INVENTION

The present invention is a system and apparatus thereof which provides automatic measurement of angles without requiring level vials or human intervention as through manual manipulation of gears, cranks and the like and the reading of scales while providing digital data which accurately reflects the angular orientation of the instrument relative to a reference line or datum line. The system is capable of providing automatic displays or digital data read-outs indicating angular relation to the reference or datum planes and is particularly well-suited for providing digital data read-outs reflecting exceptionally small increments of angular measurements. The digital data can be directly displayed, remotely displayed, transferred to data processing or acquisition systems or combinations thereof. The output can be easily placed in computer compatible codes such as binary coded decimal [BCD] but further is easily adaptable for full utilization as a direct view reading instrument in the event of failure of the electronics.

In one feature in accordance with the present invention, a light coupling system extracts data from a disc which has a plurality of cells of transparent and opaque areas. The assembly includes plates in parallel but surrounding spaced relation to the disc so that the disc can move between these plates. Each plate has one or more apertures extending therethrough perpendicular to the disc with these apertures being in alignment with one another. Light is introduced to one of the plate apertures for collimating in a direction towards the disc with an arrangement such as a cylindrical lens in proximity to the end of this aperture nearest to the inner or disc facing surface to focus the light upon the disc cells in a narrow band having a width less than the width of the disc cells. The light receiving aperture in the other plate includes an arrangement for receiving the light focused from the other side and passing through the disc and collimates this light for transfer in a direction away from the disc and into appropriately positioned light sensitive detectors. By this arrangement for narrow band light concentrating and recollimating, the transition of the transparent and opaque areas on the disc at the boundaries therebetween is enhanced so that the light sensitive device output more closely tracks the binary state change of the light being passed through the disc.

Another significant and advantageous feature of the present invention is the electronic system for insuring that accurate data is produced as an output free of potential ambiguities associated with boundary change conditions. Data sources which produce multiple groups of bits each corresponding to one of a sequentially ordered portion of the total information frequently encounter misalignment or skew problems associated with boundary transitions. Such potential read-out ambiguities occur frequently in conjunction with various data sources. By way of example, consider a coded transparent/opaque disc encoded with digital groups of tracks each corresponding to a discrete angular or linear position. For certain transition boundaries between these tracks, at least one bit in two or more of the digit groups must change simultaneously in order to insure that accurate data is being read. If a least significant ordered group represents the numbers from zero through nine and the next group represents ten through ninety-nine, the transition of the least significant group from nine to zero must be concurrently accompanied by a transition of the next group from zero to ten. If these two tracks encounter ambiguities at the boundaries, the result can easily be a false indication such as an all-zeros output when actually a ten output is intended.

The read-out system of this invention overcomes the boundary transition ambiguities and insures that the read-out will be accurate and free of these boundary misalignments by effectively keying the transitions to the least significant digit to control concurrent transitions in any higher ordered digits as required. Further, this feature of the invention establishes periodic synchronization to be sure that the data being produced is correct. The system utilizes an input which is composed of a group of least significant bits and one or more groups of higher significant bits which change state at a common transition point with one of the least significant bits as is involved in many disc codes such as the excess-3 Gray code. The invention produces output data correlated to the system input free of transition ambiguities by utilizing a circuit which is responsive to the status of the least significant bits in a zone around the transition point of generating a control signal during the presence of this zone and a transition reflecting signal as the transition point is encountered. Since the least significant digits are used for full control of the system, the information correlated to these least significant bits are coupled to a system output. However, information correlated to the higher significant bits are placed in storage and transferred to the system output from that storage device. A commutation circuit responds to the control and transition reflecting signals for disabling the storage device from receiving the higher significant bit correlated information and for appropriately altering the information in that storage device in the presence of the transition reflecting signals.

The storage device used can typically be an up/down counter circuit with the status of the least significant bits being monitored to determine the direction of transition and thus the up or down count incrementing or decrementing to be added to the counter contents to update it into accurate read-out data. The system output can take any of a variety of forms such as a direct display or can be coupled to other devices. The enabling of the storage device to receive higher significant digits during the absence of the zone around the transition or boundary points allows the storage device contents to be regularly synchronized or updated so that the transition control based upon the least significant digit transitions will result in proper read-out. Other features associated with this system include time-out controls based upon the sequence of least significant digits which indicates that the storage device has been synchronized prior to producing any read-out, various code converter elements interleaved within the system as appropriate for optimum implementation using contemporary circuit systems, the periodic pulsing of the circuitry for insuring proper operational sequencing, the monitoring of operating power to produce an output indication of inadequate power, and the like. When implemented in conjunction with a coded disc read-out, this disc can be initiated with system start-up by imparting sufficient movement relative to the sensors to insure that at least one portion of the coded segments which will accommodate synchronizing of the storage device will be encountered before the system will be fully operational for producing output data.

An object of the present invention is to provide a novel and improved system and apparatus for overcoming transition boundary ambiguity problems associated with reading data from multiple ordered and multiple bit input data.

Another object of the present invention is to provide a novel and improved system and apparatus for minimizing or avoiding the potential inaccuracies of boundary transitions associated with multiple ordered and multiple bit digit information.

A further object of the present invention is to provide novel and improved systems and apparatus for increasing the accuracy and reliability of data obtained from transparent/opaque coded discs.

Yet another object of the present invention is to provide novel and improved optical elements for improving the detectability of light coupled boundary transitions associated with transparent/opaque coded movable elements.

A still further object of the present invention is to provide novel and improved system and apparatus for avoiding boundary transition ambiguities and data read from a source by keying higher ordered digit transition to a lower ordered bit change while periodically synchronizing the read-out for the higher significant digits at points where no transitions are encountered.

The foregoing and other objects, advantages and features of the present invention will be more readily apparent in view of the following detailed description of exemplary embodiments taken in conjunction with the accompanying drawings.

DETAILED DESCRIPTION OF THE PREFERRED EMBODIMENTS

Figures 1, 2, 3:
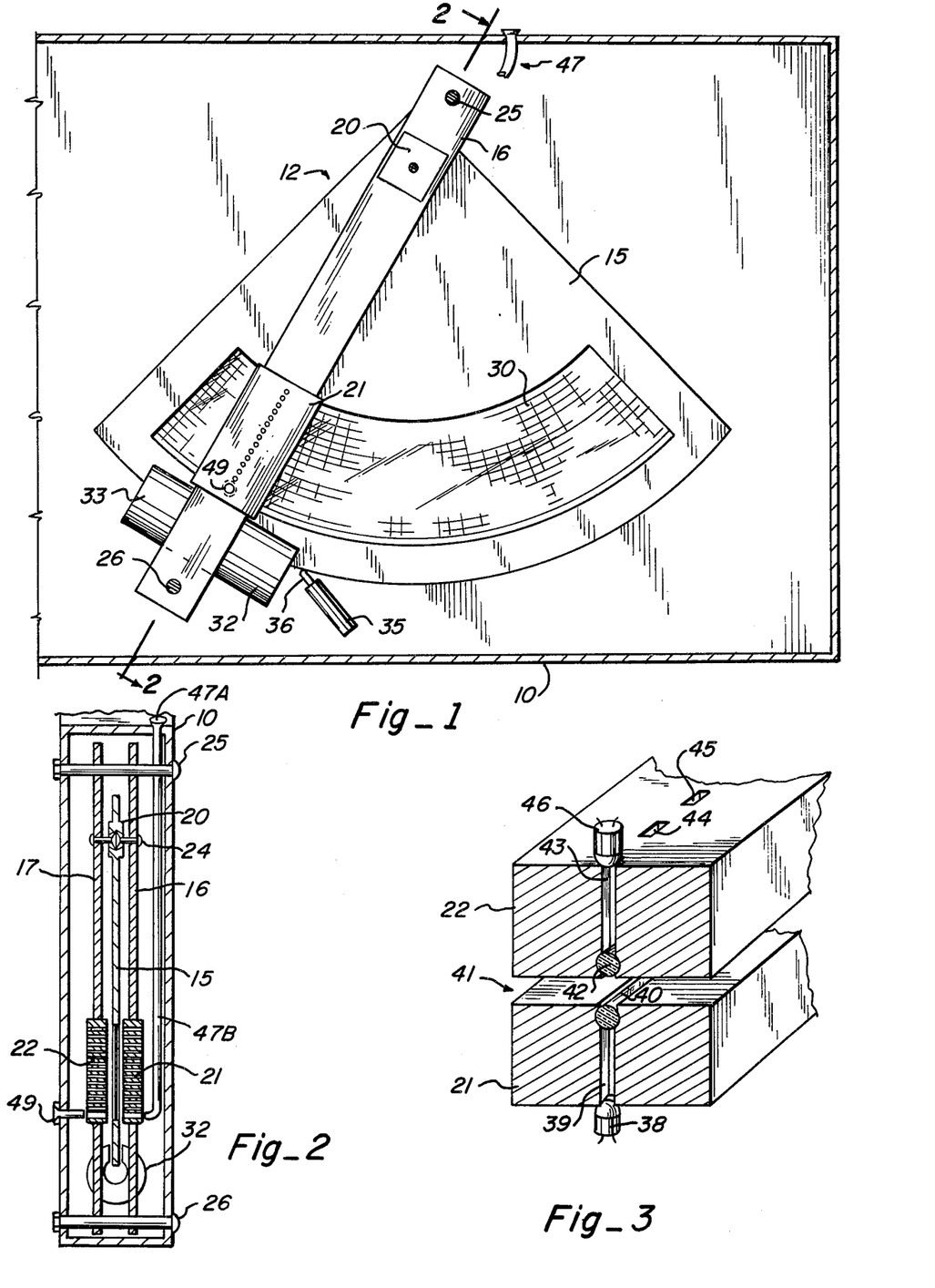
FIG. 1 is a side partially sectioned view of an angular measuring apparatus in accordance with one form of the present invention.
FIG. 2 is a section view taken along line 2—2 of FIG. 1.
FIG. 3 is a sectioned and broken view of light collimating aperture plates including emitting and detecting apparatus useful in the environment of FIG. 1.

The mechanical components for an exemplary preferred embodiment of this invention adapted for measuring vertical angular displacement from horizontal is shown in Figure 1. This vertical angle measuring assembly 12 is mounted within a housing 10 which is suitably placed on or attached to the structure for which the angular displacement from horizontal is to be measured. Code disc support member 15 is mounted for pivotal movement between fixed side arms 16 and 17. The code disc support 15 is preferably suspended by jeweled bearing arrangement 20 that allows member 15 to be suspended so that coded disc portion 30 moves freely between the aperture plates 21 and 22. The jewel suspension 20 provides a low friction pivot point for the code disc support around mounting pin 24 as can be seen in FIG. 2. The aperture plates 21 and 22 are in turn mounted to respective vertical mounting arms 16 and 17 which are attached as by bolts 25 and 26 to the housing 10. As the structure to which housing or case 10 is attached is rotated in a plane perpendicular to the pivot axis of disc support 15 about jewel bearing retaining pin 24, disc support 15 remains stationary with respect to the vertical since this support 15 is pivotally attached by this jewel bearing and aperture plates 21 and 22 move with case 10 so as to rotate relative to disc support 15. Preferably bolt 26 is arranged as an adjustable eccentric mount so that minor radial adjustments can be made as needed for zero alignment.

Code disc 30 retained by support 15 is sandwiched between aperture plates 21 and 22 as is best seen in Figure 2. On plate 22 in an array of infrared sensors and the rear of plate 21 has an array of infrared emitters as will be described subsequently for FIG. 3. As the aperture plates 21 and 22 move in relative rotary motion with respect to disc 30, the sensors detect a pattern of infrared energy created by the appropriately coded transparent/opaque screen of disc 30. That is, code disc screen 30 contains clear and opaque areas in radial tracks, that collectively and uniquely define each angular position. As will be described later, the electronics interprets these patterns and displays accurate vertical angular information as to the displacement of the device relative to horizontal.

For the mechanical system to operate properly, the suspension must have low frictional forces. The mass of the code disc support 15 and its suspension in conjunction with the jewel bearing must yield a system that allows disc support 15 to settle to within the least significant angle increment for any displacement of disc support 15. To do this for small angles such as 0.1° requires a settling time of greater than one minute in the undamped case. This pendulum-like action of disc support 15, while necessary for accuracy, generally would not be tolerable from an operational standpoint. Any vibration or movement prevents a reading. To overcome this problem, disc support 15 is damped in such a way that the settling time is decreased but the final settling positions unaffected.

More particularly, damping is accomplished by eddy current brake action. As visible in FIG. 1, two magnets 32 and 33 are attached to the support arms 16 and 17 for the aperture plates 21 and 22. The outer portion of the copper code disc support 15 rotates between the poles of the magnets as is most clearly visible for magnet 32 in FIG. 2. Rotation of the copper disc support 15 relative to the magnetic flux of the magnets creates circulating currents in the copper discs that set up a counter magnetic flux opposing movement. With the arrangement shown using Alnico ring gap magnets (Edmund Scientific No. P-40,964) for magnets 32 and 33, a damping ratio of about 0.3 has been obtained with a settling time of less than 2.5 seconds for a stepped displacement of 60°.

A disc lock solenoid 35 is attached to the case 10 as can be seen in FIG. 1. Solenoid 35 includes a plunger 36 which is normally biased outwardly until it engages the peripheral edge of disc support 15. When power is applied to the instrument, solenoid 35 is actuated so as to withdraw plunger 36 thereby releasing disc support 15 to allow it to pivot freely. Further, by causing plunger 36 to peripherally engage the edge of disc support 15 at an angle as shown in FIG. 1, the application of power to solenoid 35 will effect a slight rotary movement to disc 15 thereby establishing synchronization as will be described below in association with the electronics. It should be noted that mechanical linkage for releasing solenoid 35 externally from case 10 can be included to allow the device to be utilized in the absence of operating power as will also be described subsequently.

Although the mechanics of the angular measuring preferred embodiment described thus far are more or less straightforward, the precision of the parts is critical to proper operation of the instrument. To appreciate this, consider an instrument that has a range of operation from + 1350 mils to − 200 mils [one mil equaling 0.05625°] as might be applied for use on an artillery piece. This requires 1,550 words of fourteen bits each for information on the code disc 30 or 21,700 data bits stored on code disc 30. With a three inch minor radius of the code disc 30 [i.e.: the first track starts at 3 inches from the pivot point of jewel support 20], a different word of angular information occurs every 0.002945 inches. With a 0.08 inch track length on an arc relative to the pivot point of jewel support 20, the fourteen bit word representing a discrete angle is contained in a zone of about 0.003 inches in width by 1.12 inches in radial length.

An optical system in accordance with the present invention for extracting information from code disc 30 is shown in FIG. 3 which is a cross-sectional view of aperture plates 21 and 22 particularly illustrating the optical system. At one side of aperture plate 21, a series of infrared emitters such as 38 are mounted by suitable means [not shown] such as a printed circuit board, mounting slot cut into the aperture plate or the like. The light rays from the emitters are directed into respective collimator channels such as channel 39 which partially collimates or provides parallel rays to the converging cylindrical lens 40. Ideally, lens 40 converges the rays from each emitter to a line at the focal point of the lens on the surface of the code disc. This provides an intense narrow infrared line at the code disc 30 which is passing between plates 21 and 22 in the open space 41 therebetween. The intense narrow IR line ideally illuminates only one data bit width which is less than 0.003 inches. The narrow IR beam is either interrupted by code disc 30 when an opaque area thereof intervenes or is passed by a transparent or clear area of disc 30.

In this exemplary embodiment, clear areas are assumed to represent logic zeros and dark or opaque areas represent logic ones. Of course, the areas could be electronically monitored, as is known in the prior art, so that the clear areas could represent logic ones and the dark areas could represent logic zeros, for interpretation being one of choice for a given circuitry. If the rays are passed through disc 30, they converge beyond the focal point and are intercepted by the receiving magnifying cylinder lens 42. Lens 42 tends to partially collimate the rays and directs them into the receiving aperture channels such as 43, 44 and 45. At the output opening of these receiving aperture channels are positioned appropriate infrared sensors such as sensor 46 which receives light only originating from emitter 38 after passage through transparent areas of the intervening disc 30. These input and output aperture channels for the light prevent cross talk from adjacent channels.

Although only one optical channel including openings 39 and 43 has been shown, it will be appreciated that there is a complete channel including emitter and sensor for each cell of any given radial track of information. However, cylinder lenses 40 and 42 are common to all channels. Aperture plates 21 and 22 with their channels in appropriate alignment maximize the optical efficiency of the system and minimize cross talk from adjacent channels.

Figure 13:
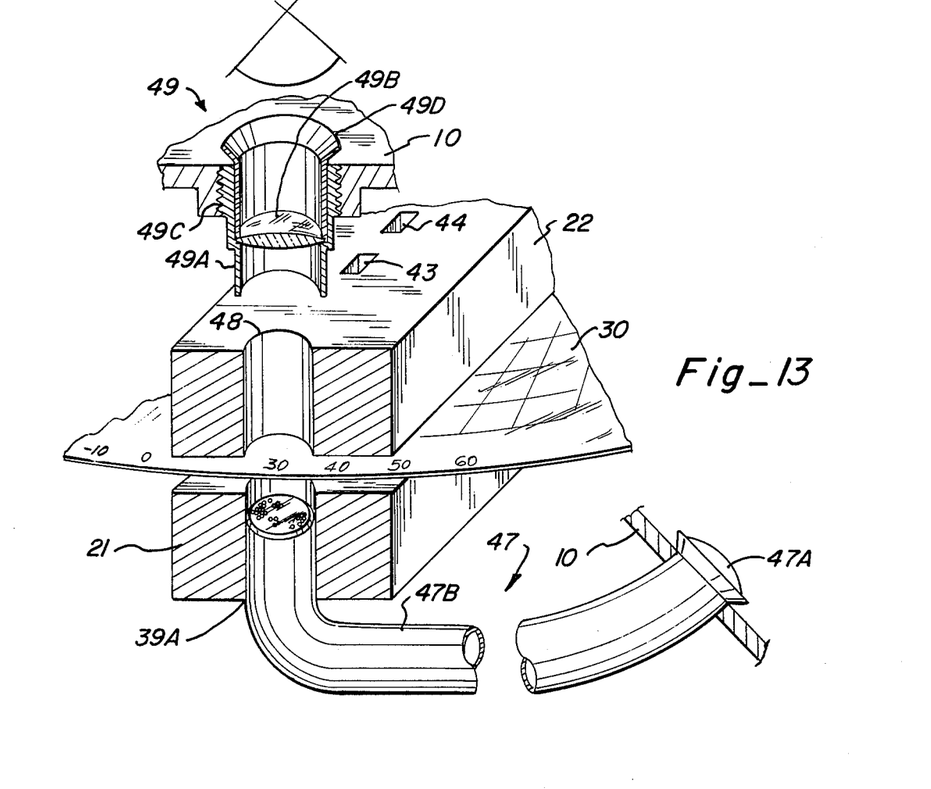
FIG. 13 is a partially broken and sectional view of optical elements for permitting visual reading of the disc orientation.

In addition to the optics described, means can be included by which the angle can be visually observed directly from the disc in the event of power loss, an exemplary implementation of this being shown in FIG. 13. The outer radius of disc 30 and/or disc support 15 can be arranged to have numbers inscribed thereon corresponding to the angle. The FIG. 13 illustration shows the mil numbers as inscribed or photographically formed on the outer circumferential edge of disc 30. These numbers are illuminated such as by a fiber optic assembly 47 including a light collecting lens 47A coupled to light transferring means 47B which might be a bundle of fiber optic elements, a single optic tube or the like. Collector lens 47A is attached to the top surface of case 10 for receiving ambient light as seen in FIG. 2 although a separate light source could be used such as via battery powered lamps or the like if desired. Optic bundle 47B terminates in aperture 39A of plate 21 as shown although it should be noted that lens 42 does not extend to the opening of aperture 39A in this instance. Light from the inner end of bundle 39A illuminates the area around the edge numbers on disc 30 which light then passes through aperture 48 of plate 22 into receiving assembly 49. Assembly 49 includes tube 49A, magnifying lens 49B, mounting hardware 49C and eye piece or cup 49D attached to the side of case 10 (note FIG. 2) or otherwise conveniently located.

The electronics associated with the optical read-out must be able to [1] extract the fourteen bit data words from the disc as detected by the optics, [2] convert the disc code to a suitable code for use in other equipment such as a standard display code, and [3] display or communicate the converted code corresponding to the measured angle to appropriate utilization circuitry. A wide variety of conventional devices and techniques are available to accomplish the second and third items mentioned in the preceding sentence but the first item is a singularly difficult result to accomplish as a practical matter but is advantageously obtained through yet another feature of the present invention. To illustrate, assume that each fourteen bit data word of angle information corresponding to a one mil or 0.05625° increment is contained in a zone on the code disc 30 within the perimeter of approximately 0.003 inches by 1.12 inches. For the instrument to operate correctly, it is essential that all digits change simultaneously at the transition points. For example, a correct sequence might be 099, 100 and 101. If the optics and sensors are skewed or misaligned to any extent at the transition boundaries, an incorrect sequence of 099, 199 and 100 or 099, 000 and 100 might result.

Obviously the foregoing transition areas are only one example of the multiple potential errors associated with reading a code disc. In fact, a potential reading error exists at each and every boundary point. To eliminate the problem by conventional means demands either that the disc be made with an extremely large radius which is unacceptable for many applications or that some sophisticated system for sampling the code disc data at the center of each zone be employed with data sampling at the zone boundaries being inhibited. Experiments with the optics have indicated that there must be a 0.001 inch guard band on each side of the zone boundary for a total of 0.002 inches of inhibit zone. This leaves only 0.001 inches to sample the data. Since the zone is 1.12 inches long, the total misalignment over the 1.12 inches cannot exceed 0.001 inches or 0.051° over the entire area of the disc. As a practical matter, maintenance of this degree of alignment over the entire surface is difficult if not impossible whether angular measurements as generally shown in this application are involved or even more so when larger angle measurements must be measured such as up to 360° as with compass heading detection. Distortions as from manufacture, environmental temperature variations and the like further aggravate the alignment problem as to the aperture plates, lenses and code discs.

The electronic data handling feature of the present invention advantageously overcomes the aforementioned problems and reduces the requirement for accurate alignment of the optics and word zones on disc 30. For a fourteen bit word zone, this feature allows for an alignment error of about 0.01 inches as compared to the 0.001 inch tolerance demanded by the central zone sampling systems of the prior art of the exaggerated radius for the disc for other systems. Stated another way, the electronic data handling feature of this invention allows the use of a code disc of about one-tenth the diameter required by conventional strobing techniques.

The data handling system uses a conventional cyclic code such as the excess-3 Gray code for the first or lowest order digit. This minimizes skew problems of the first digit because only one bit is changed at a zone boundary for that digit. However, this does not solve the skew problem at the transition point of the remaining digits since multiple changes take place whenever the higher order digits change. The electronic data handling feature of this invention forces the commutation or change of all high order digits to take place at the correct time independent of misalignment of the data bits of the higher order digits. Further, this feature of the invention provides synchronization at points not affected by skew or misalignment.

Figure 4:
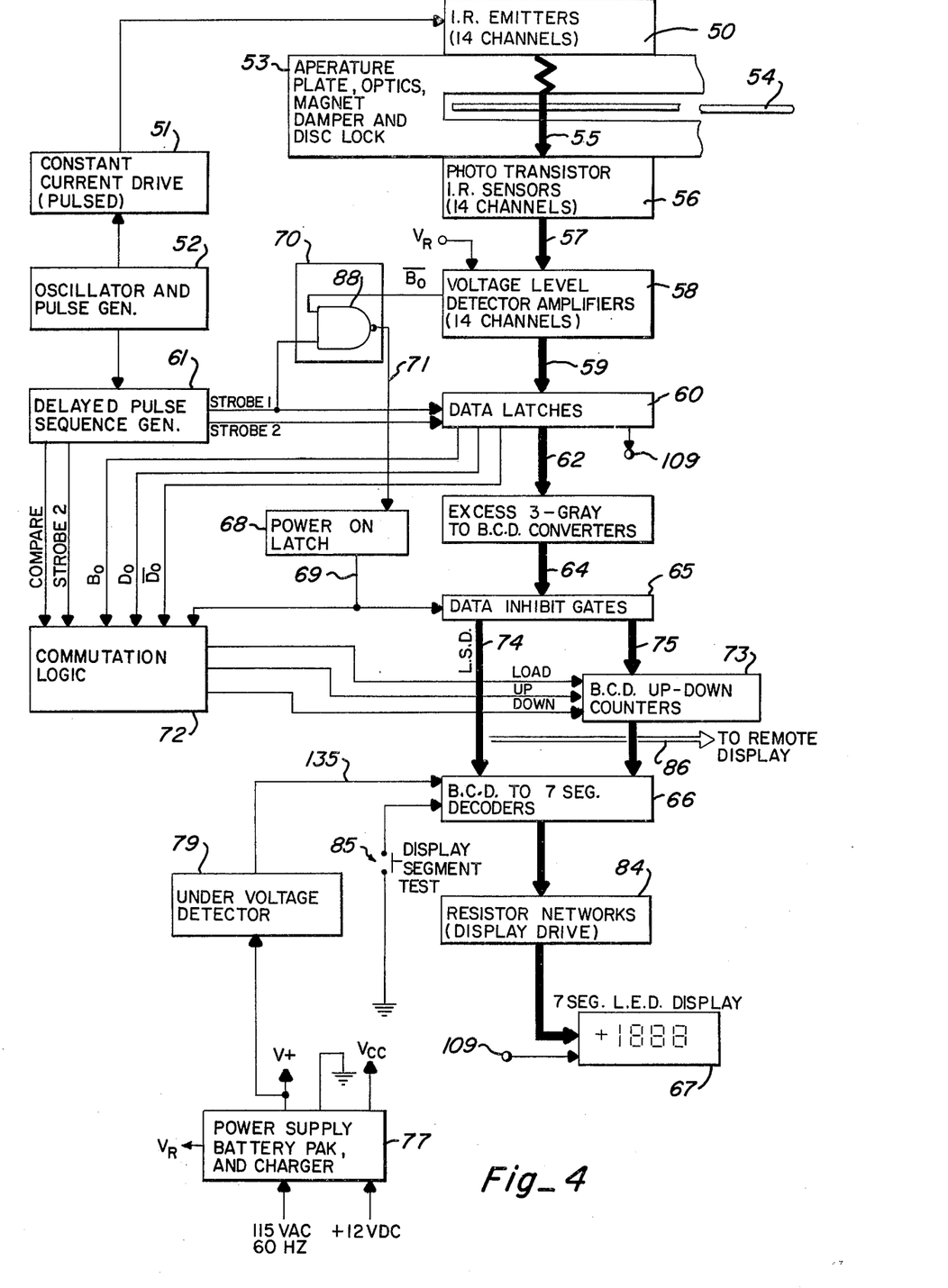
FIG. 4 is a general block diagram of electronic circuitry associated with digital data detection and handling in accordance with the present invention.

A block diagram illustrating one example of implementing the electronic data handling feature of this invention is presented in FIG. 4. The wider or darker coupling lines are intended to indicate multiple line information or data flow while the narrower or light lines generally indicate single or timing and control lines. An array of IR emitters 50 contain one emitter for each aperture channel and in the example shown uses fourteen emitters and channels for a range of + 1350 mils to − 200 mils. Emitters 50 receive drive current at periodic intervals with a relatively low duty cycle factor from constant current drive 51. By using pulse power for actuating emitters 50, power dissipation is reduced by reducing the average current. The constant current drive circuit 51 is pulsed by oscillator and pulse generator circuit 52 which contains a free running oscillator and pulse generator. In a typical operating example, constant current drive 51 produces pulses of about 200 microsecond width at a rate of one hundred pulses per second (PPS).

Figure 9:
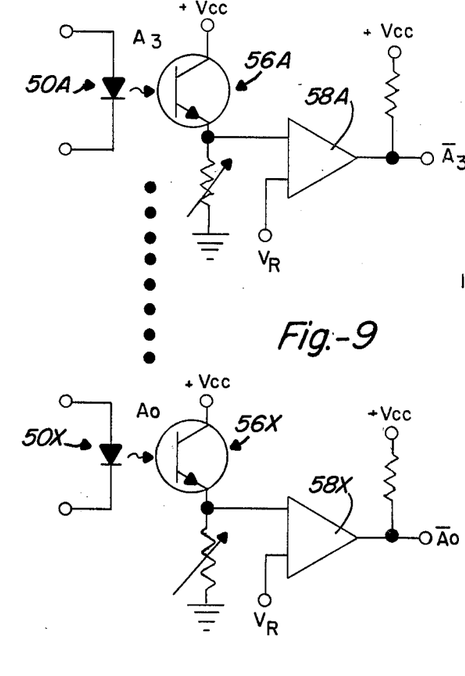
FIG. 9 illustrates typical circuitry associated with light detection signal generation.

Block 53 generally indicates the aperture plates, optics, magnetic damper, disc lock, mounting and pivoting structure generally described hereinbefore and the disc 30 with its support is shown at 54. The infrared energy shown symbolically at 55 from emitters 50 passes through the aperture plates and is modulated by the pattern on code disc 54 as explained previously. The resulting beam pattern is detected by phototransistors or infrared sensors 56 located on the opposite side of the aperture plates. The output of sensors 56 as shown at 57 is a current proportioned to the infrared energy received from emitters 50. These fourteen channels or pulsed current are transmitted to the voltage level detector amplifiers 58. Amplifiers 58 convert the current to a proportional voltage and the voltage is compared to a reference voltage $V_r$ so that a decision is made as to the on or off state of each sensor 56. This is illustrated in somewhat greater detail in FIG. 9 wherein the outer and inner tracks are shown but with it being understood that twelve additional identical tracks would be included therebetween. Thus, emitters 50A and 50X each are directed through appropriate aligned apertures and intervening disc cells to a respective phototransistor 56A and 56X. The output of these phototransistors as sensed from the variable resistances in the emitter circuit thereof is coupled as one input to a comparator amplifier 58A or 58X. If the output exceeds the additional input to these amplifiers in the form of reference voltage $V_r$, an output signal is produced as shown in FIG. 9. That is, if the disc intervening between 50A and 56A is transparent so that light is conducted therethrough so as to cause phototransistor 56A to conduct, this indicates that a one condition is being sensed so that the not-A3 output is caused to go low. Similar operations are performed for each of the other light channels and emitter/sensor combinations.

The resulting pattern of pulses represents a fourteen bit word of information that describes the particular angular orientation of the intervening disc. As seen in FIG. 4, this pulse pattern is presented in parallel through lines 59 into data latches 60. Since the data is present for a relatively short time period as a result of the pulsing of the emitters, the data must be captured and stored for the time period between samples. Accordingly, the data is strobed into memory latches 60 by the Strobe 1 pulse from delayed pulse sequence generator 61 with the Strobe 1 pulses occurring at the same repetition rate as the emitter drive pulses. The Strobe 1 pulse is delayed relative to the start of the emitter drive current pulse to allow the pulse pattern to stabilize before the data latches 60 are updated by the Strobe 1 pulse.

Figure 5:
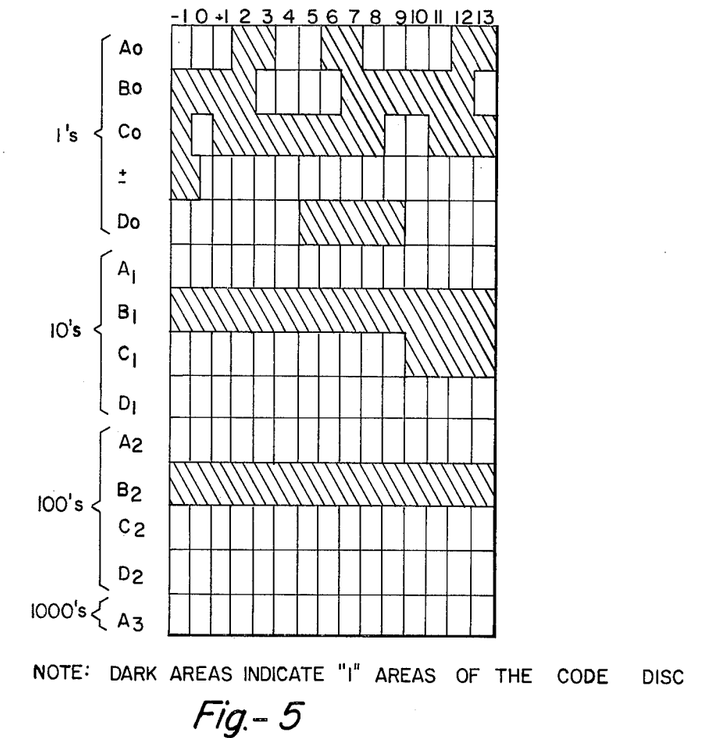
FIG. 5 is a portion of a typical light transparent and opaque disc useful with the invention.

The information stored by data latches 60 is in the form of the excess-3 Gray code read from the sensors for each digit. Although the adaptation of such Gray code sequences to discs are generally well understood, FIG. 5 shows an example of the segment pattern for several mils with such a code. It will be understood that FIG. 5 is not a true scaled area of the disc since each mil radial would be narrower at the top and wider at the bottom. However, the matrix form of the segment of the disc as shown in FIG. 5 serves to identify bit positions of the excess-3 Gray code over a specific series of mil segments on either side of the zero radial. The excess-3 Gray code has the advantage of having only one bit change at one time without a digit. This can be seen by examination of the ones digit ($A_o$-$D_o$) of FIG. 5. The code is generally not convenient for processing and thus is typically converted to a more acceptable version such as binary coded decimals [BCD] as in the converter 63 of FIG. 4.

Figure 7:
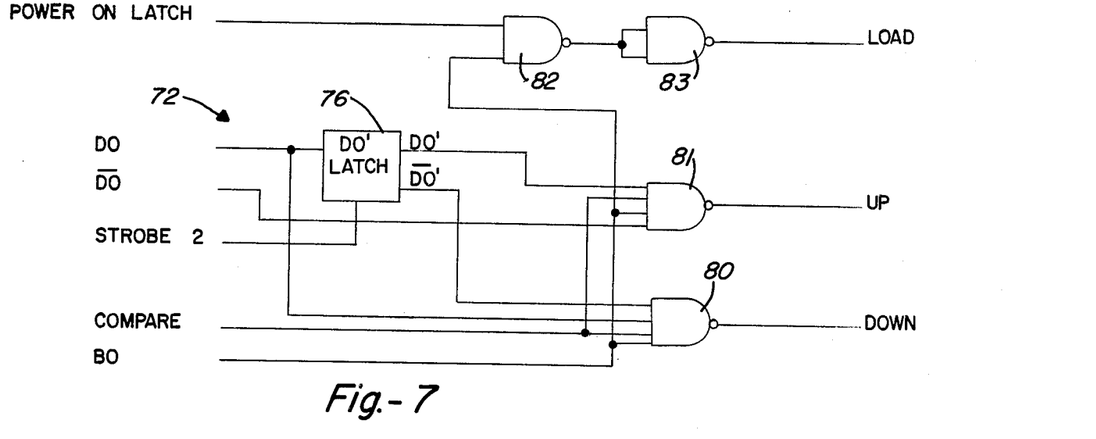
FIG. 7 is a circuit diagram of commutation logic useful in the FIG. 4 environment.

When power is first turned on, the system is not necessarily synchronized to the correct angle position. To prevent displaying an incorrect angle, data inhibit gates 65 force a display "off" code to the BCD to seven segment decoders 66. That is, until power on latch 68 is cleared, it forces gates 65 to produce all ones at lines 74 and 75. Further, as can be seen in FIG. 7, latch 68 forces the Load line to counters 73 to stay in the load mode thereby ignoring any up or down pulses from logic 72 and passing all ones on the BCD to seven segment decoders 66. Decoders 66 interpret an all ones input as an invalid code and force a dark or off display at display units 67. Data inhibit gates 65 are controlled by the output 69 of power on latch 68. Latch 68 is cleared to allow normal data flow by the power on latch clear logic of logic block 70 as enabled by output line 71. That is, the concurrence of the clock pulse Strobe 1 and not-$B_o$ from the appropriate amplifier of 58 causes AND 88 to be conditioned so as to generate an enabling signal 71 for setting power on latch 68. The system is forced into synchronization when the code disposition is in or moved into the three, four, five or six mil segment positions in the least significant digit as indicated by the $B_o$ clear area shown in FIG. 5. The presence of not-$B_o$ at the output of amplifiers 58 and Strobe 1 into logic 70 in conjunction with the commutation logic 72 causes synchronization and clearing of the power-on latch 68 which thereafter allows normal data flow. This synchronization operation will be described in greater detail subsequently.

It was earlier mentioned herein that electronic commutation of all digits except the least significant digit [LSD] greatly increases the tolerance for misalignment of the optics and the code disc word zone. It is this feature of the present invention which advantageously permits an instrument to be built at a reasonable and practical size and cost. This result is obtained by the cooperative interrelationship of the various elements shown in FIG. 4 but particularly the BCD up/down counter 73 and commutation logic 72. At the output of data inhibit gates 65, the least significant digit BCD data as present on lines 74 is transmitted directly to the BCD to seven segment decoders 66. Thus, LSD information propagates through the system from the code disc to the displays 67 without regard for commutation across zones. This is possible since only one bit changes at a time at the zone boundary within a single digit for the excess-3 Gray code. However, at the nine to zero or zero to nine transition boundaries of the LSD, one or more bits of the higher order digits may also change. This multiple changing of bits at those points causes the potentially severe alignment problem previously described.

As is evident from FIG. 4, the higher order digit information is not transmitted directly to decoders 66 but instead is directed to the BCD up/down counters 73 over output lines 75. Counters 73 are operated in two basic modes, load mode and up/down mode. In the load mode, higher order digit information is loaded into counters 73 and is transmitted via counter 73 to decoders 66. In other words, the output data of counters 73 is the same as the input. For the load mode, commutation logic 72 produces an appropriate enabling load signal as will be described subsequently which event occurs in the 3-6 LSD mil segment positions of FIG. 5. The clear area of $B_o$ shows the zone of operation for the load mode. This zone occurs every cycle of the LSD, it being understood that the pattern of the LSD shown in FIG. 5 [ignoring the $+/-$ track] is cyclic for any sequential ten radial positions with the negative mil segment pattern being effectively a mirror image of the positive mil segment pattern. The load mode allows the up/down counters 73 to be synchronized to the code disc data at positions on the code disc data that are removed from the multiple transition points by three LSD positions. This allows misalignment of up to three channel widths without affecting synchronization. This tolerance can be further improved upon by narrowing the load mode zone to the fourth and fifth mil segment positions and reordering the bit positions which would increase the misalignment tolerance from three to four channels in widths. However, the principles of operation are identical to that described above. Synchronization takes place for each cycle of the LSD. Accordingly, when power is initially turned on, disc movement for synchronization is never required to be more than six LSD positions. In the example herein illustrated, this corresponds to six mils. As previously explained, the instrument will not display the angle until synchronization has taken place. The synchronization is assured by electro-mechanically "kicking" disc support 15 through a small angle when power is turned on by means of the operation of solenoid 35 shown and described for FIG. 1.

With counters 73 synchronized at points removed from the multiple transition boundaries, counters 73 must be made to step up or down to increase or decrease the count at exactly the instant the LSD changes from zero to nine or nine to zero. Commutation logic 72 accomplishes this and is shown in somewhat greater detail in FIG. 7. As can be seen from FIG. 5, $D_o$ changes from a one to a zero at the nine to zero transition of the LSD (i.e.: nine mils to ten mils, nineteen mils to twenty mils, etc.) and conversely changes from zero to a one at the zero to nine transition of the LSD. Commutation logic 72 detects this transition and causes the BCD up/down counter 73 to step in the proper direction. By doing this, commutation of higher order digits is accomplished without regard for misalignment at the transition points.

Figure 6:
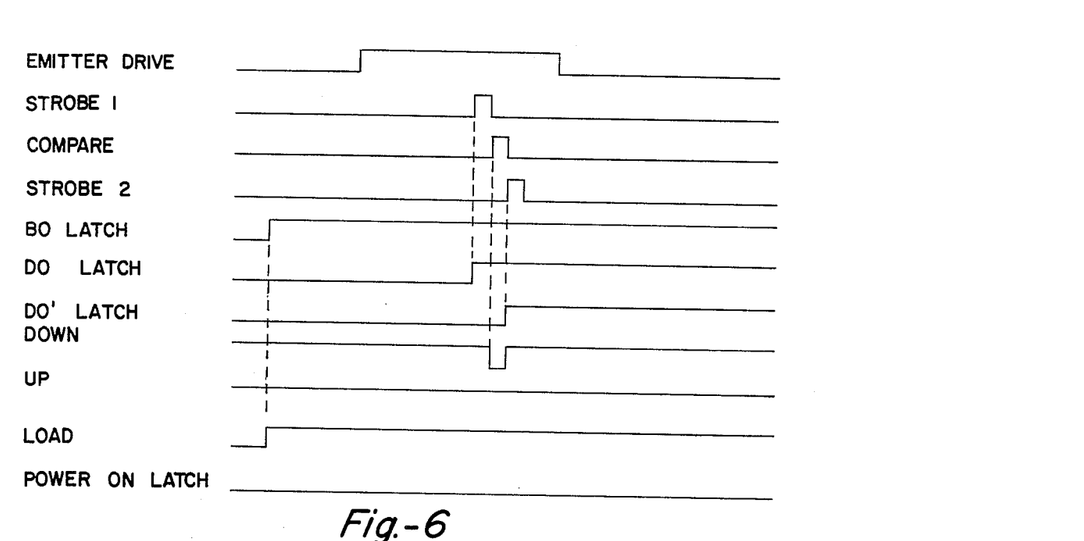
FIG. 6 is a time-based diagram of electrical signal events for a typical down count operation.
Figure 8:
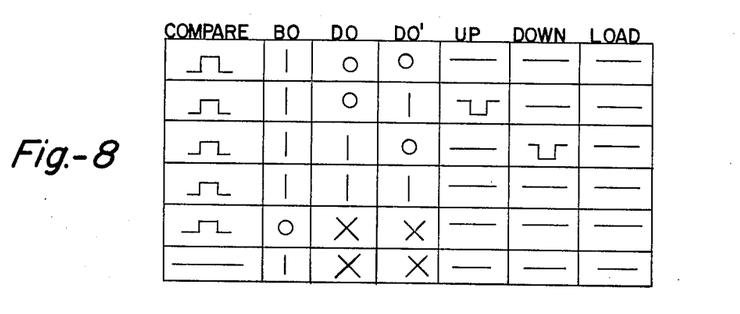
FIG. 8 is a truth table associated with the Figure 7 circuit operation.

FIG. 7 is a specific logic diagram of the circuitry for commutation logic 72 with FIG. 8 presenting a truth table of this logic and FIG. 6 illustrating an operating sequence particularly associated with generation of a down count for the higher order digits. As mentioned above, information is stored between samples of the code disc by the data latches 60 (Note FIG. 4) and D$o$ is stored in one of these latches. Commutation logic 72 receives disc output both as to the D$o$ and not-D$o$ states with D$o$ information of the last sample being stored in the D$o'$ latch 76. The commutation logic 72 compares D$o$ information of the present sample with the D$o$ information of the last sample stored in D$o'$ latch 76. After the comparison is finished, D$o$ information is transferred to D$o'$ latch 76. The truth table of FIG. 8 shows the desired outputs for various potential combinations of inputs to commutation logic 72. An examination of D$o$ and D$o'$ show that when they are identical or haven't crossed a nine to zero or zero to nine transition, there is no up or down pulse generated. An up or down pulse is generated when they differ as at the nine to zero or zero to nine transitions since the last sample time. The D$o$ transition at the boundary between the four and five mil segments is ignored by commutation logic 72 since B$o$ is then disabling gates 80 and 81 during which time the Load line is enabled. Note that with this approach only one up or down pulse can be generated for each sample taken. Also if a noise burst should result in D$o$ storage of incorrect data that results in an incorrect up or down pulse, the condition is corrected at the next sample time following the noise burst by generating an opposite up or down pulse.

The count controlling operation of the commutation logic 72 shown in FIG. 7 may be better appreciated from the down count sequence example shown in the time-base diagram of FIG. 6. B$o$ is shown going high prior to the start of the sequence. This causes Load to also go high indicating that the counters 73 are not in the load or synchronize mode as described above. The sequence starts as the emitter drive current is brought up. After a delay period of sufficient length to stabilize the information at the sensor 56 outputs, Strobe 1 gates the D$o$ information into the D$o$ latch in latches 60. Following Strobe 1, the Compare pulse enables commutation logic 72 and allows the comparison of the contents of the D$o$ latch with the D$o'$ latch 76. In this case, the comparison results in a Down pulse in accordance with the truth table of FIG. 8. Following the Compare pulse, Strobe 2 causes the D$o'$ latch 76 to change state and thus remember the D$o$ logic level that resulted in the down pulse. This status is then used for comparison at the next sequence.

Figure 11:
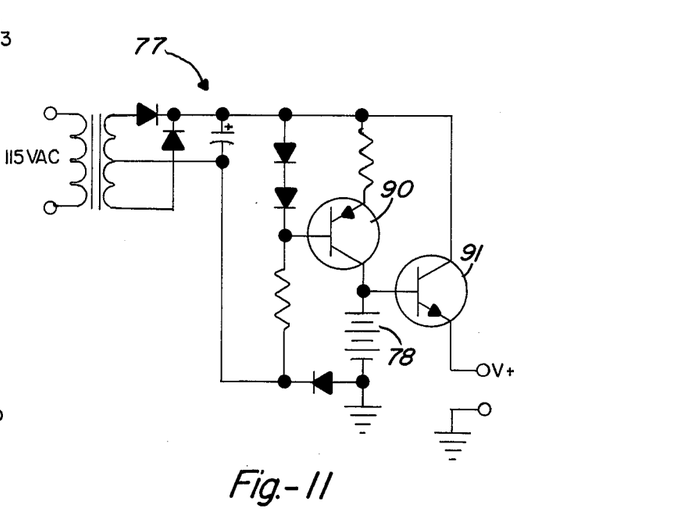
FIG. 11 is a typical power supply system with automatic DC back-up capability.

The power supply 77 shown in FIG. 4 is preferably adaptable for different potential power sources such as twelve volts DC or one hundred fifteen VAC, 60 Hz. In addition, the system as shown in FIG. 11 for use with a 115 VAC source changes over to an internal rechargeable battery or batteries 78 without interruption of the instrument used in the event of failure of the 115 VAC source. With AC applied, output transistor 91 acts as an emitter follower in that the emitter voltage follows the base voltage. Battery 78 furnishes the reference voltage to the base and the load current flows through the collector-emitter circuit of transistor 91. With AC removed, load current is supplied by battery 78 through the base emitter circuit instead of the collector-emitter circuit of 91. With this arrangement, the change over is instantaneous with no interruption of power to the instrument. With AC applied, battery 78 is charged by the constant current source circuit of transistor 90.

Figure 12:
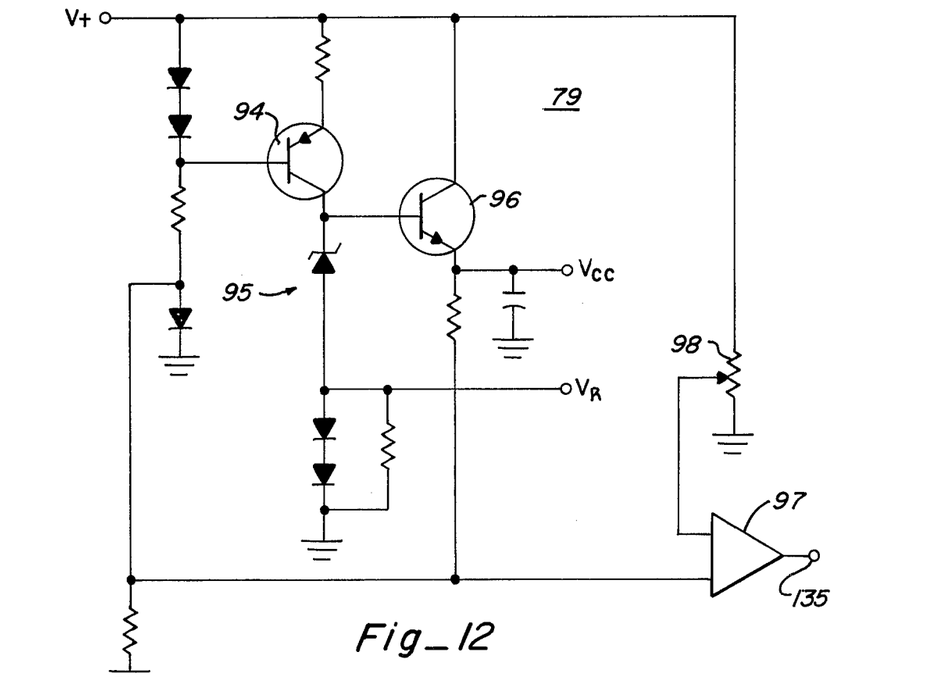
FIG. 12 is a typical regulator and under voltage detection circuit.

Under voltage detector 79 shown in FIG. 12 monitors primary power V+ from source 77 and employs transistor 94 and zener diodes 95 to establish the reference voltage VR. Transistor 96 produces secondary sources for secondary power source Vcc at the emitter and likewise establishes one input to comparator 97, the other input being a selected reference level from potentiometer 98. Detector 79 senses a low voltage condition of power supply 77 and responds by generating output 135 for forcing all segments of displays 67 to light giving a visual indication of the condition such as by the display actually illustrated in FIG. 4. The implementation of this under voltage condition indication can be any of a wide variety of arrangements such as by inhibiting gates 65 and lighting a separate warning lamp or the like.

FIG. 5 shows the X or sign change [+/−] track which produces a one for all negative segments from the midpoint of the zero segment and produces a zero for all positive segments. The status of this sign change level of the +/− track is stored in an appropriate latch in the data latches 60 as will be discussed below in conjunction with FIG. 10. In addition, note that the output for clearing the power on latch 68 is produced whenever B$o$ is a one and a concurrent Strobe 1 pulse occurs.

Figure 10:
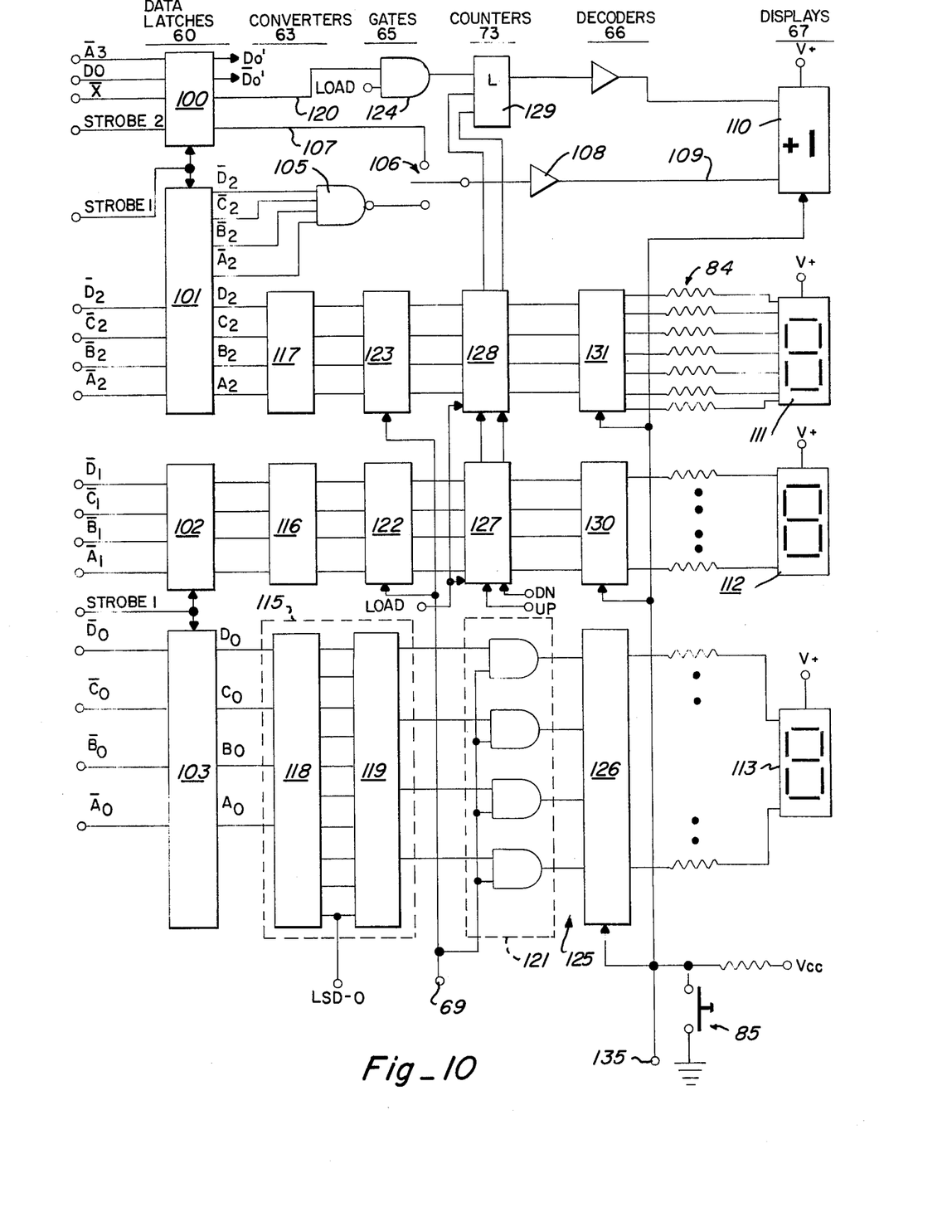
FIG. 10 is a more detailed circuit diagram of some of the elements associated with FIG. 4.

FIG. 10 presents some of the particular circuit components employed in constructing a device in accordance with the elements of the general block diagram of FIG. 4. Each of the A-D and X inputs indicated along the left side of FIG. 10 are produced by a discrete set of emitters, detectors and comparators as has been discussed above for FIG. 9. The Strobe 1 and Strobe 2 pulses are produced by conventional pulse sequence circuitry from circuit 61 of FIG. 4 and in the manner illustrated in FIG. 6. Further, the load, up and down inputs are produced by the commutation circuitry as shown in FIG. 7.

Data latches 60 are shown implemented by four integrated circuits 100-103 which typically might be each an SN5475. Thus integrated circuit elements 100-103 effectively include four latch elements each cleared or set depending upon the four inputs thereto with this storage being effected by the Strobe 1 pulse for all latches except the D$o'$ latch which is responsive to the Strobe 2 pulse as explained previously in conjunction with FIGS. 6-8. Elements 100 include at least one latch position sensitive to the X detector output to store an indication of the positive or negative direction of the reading. Note that FIG. 10 illustrates an alternate structure for obtaining the sign status by the output of AND circuit 105 which produces an output signal whenever all of the 100s tracks are producing a one. Thus, this occurs at the not outputs of the 100's latches (not-A2 through not-D2). Switch 106 can accept the sign indicating output of the X latch as produced at line 107 to couple into inverter 108 and thence to the sign input 109 of display 110 or can accept the output of AND 105. This alternate method can be used when a separate +/− or X track is not available on the code disc.

The excess-3 Gray code to BCD converters 63 are implemented in the form of pairs of integrated circuit modules 115-117 which are identical and with only converter 115 being shown in detail. The status of the four latches associated with blocks 101-103 are monitored by a gray-code-to-decimal converter element 118 to provide the ten inputs to a decimal-to-binary-coded-decimal converter unit 119. Typically, the converter element 118 is an SN54144 while the unit 119 is an S54147. Since the highest significant digit as represented by the A3 track of FIG. 5 is binary in nature, it does not require this conversion stage and thus is coupled directly as by line 120 to the subsequent stages. Note that the lowest decimal line output of unit 118 identified as LSD-0 could be utilized in yet another alternate implementation for the sign change detector in conjunction with appropriate clock pulses and logical interpretation of the higher significant digits.

Gates 65 are comprised of a series of subassemblies 121-123 and a single gate circuit 124 for the highest order bit. As mentioned previously, these gate assemblies are de-conditioned until the power-on latch 68 has been cleared thus producing an enabling signal at input 69 to allow the output of converter units 115-117 and the status of line 120 to be passed to the subsequent stages. Also as mentioned previously, the output of the least significant digit as represented by the outputs 125 of gates 121 is coupled directly into its associated decoder element 126 and thence into the display output 113 through the resistor network 84 associated therewith.

However, the outputs of the higher order bits from gates 122-124 are coupled into a serially connected set of counter stages including BCD up/down counter elements 127 and 128 along with latch 129. That is, elements 127-129 form the BCD up/down counters 73. Typically elements 127 and 128 are SN74192 units connected in series such that an overflow in the up or down counting of element 127 increments element 128 while an up or down overflow from counter 128 will set or clear the highest significant digit represented by latch 129. As has been discussed above, counter stages 127-129 are loaded by an appropriate load signal from the commutation logic 72 of FIG. 7 to effect synchronization at appropriate points where it is evident that misalignment will not cause erroneous data to be gated or loaded into these counters. Thus counter elements 127-129 will ignore the presence of the output of gates 122-124 except when the load enable signal is present. The incrementing of these counters in conjunction with zero to nine and nine to zero transitions is then effected by appropriate up or down count additions as discussed previously for the commutation logic 72 and particularly in FIG. 7.

Finally, the outputs of counters 127 and 128 are introduced to BCD to seven segment decoders 66 including elements 130 and 131 which, in conjunction with the output of seven segment decoders 126 and the output of latch 129 form the composite of the four significant digits representing the angular position of the disc at any given time. Typically, decoders 126, 130 and 131 are SN5447A units. Further, display 110 is typically a TIL 304 unit connected to produce a + or − sign and, depending on the state of latch 129, also a one or no display. Display units 112-113 are typically either TIL 302 elements or Litronix DL10A units. Note that input 135 as produced by the under voltage detector 79 is connected into decoders 126, 130 and 131 to cause them to produce an all segment illumination command to the displays and is further coupled to display unit 110 to produce a similar result. The test switch 85 produces a similar result when actuated so that the user can determine that all segments are operational for displays 110-113.

In a typical implementation of the present invention, the emitters 50 can be TIL 24 light emitting diodes and the phototransistors 56 can each be TIL 604 units. Note in FIG. 4 that the output of the data inhibit gates as represented by lines 74 and 75 can be coupled to a remote display as by lines 86 or to a remote data acquisition and data processing or handling system as may be desired either conjunctively with the direct displays or independently thereof. Further, output cable 86 can be coupled to additional display elements or the like.

Reviewing the use of the present invention as for the measurement of horizontal angular displacement in accordance with the preferred embodiments shown, the housing or case 10 is attached to or placed on the element for which angular displacement measurement is required. The power to the system is turned on which immediately effects release of solenoid 35 so as to withdraw plunger 36 thereof and impart an initial small increment of movement to disc support 15. Pulsing on a low duty cycle of the emitters 50 is commenced with the application of power to the system so that light is periodically directed through the appropriate channels and either passed or blocked by coded disc 30. The infrared or phototransistor sensors 56 thus commence producing output signals in parallel reflective of the apparent vertical orientation of coded disc 30. This angular displacement indicating data is coupled through amplifiers 58 and transferred into data latches 60 regardless of the accuracy thereof and is continuously updated as disc 30 moves. Although the content of the data latches 60 is converted from the excess-3 Gray code to BCD code by converter 63, this output is not utilized until after the conditions required for the power-on latch 68 to be cleared exists as reflected by an enabling signal on line 71 from the power-on clear logic 70. Up to that point in time, the output of converter 63 on cable 64 is blocked from further usage by the system via data inhibit gates 65. However, once power-on latch 68 has been cleared so as to produce the enabling output 69, the lowest significant digit 74 is directly coupled into decoder 66 while the higher order significance digits as represented by cable 75 are loaded into counters 73 under control of the commutation logic 72. This commutation logic in response to a sequence of pulses from the delay pulse sequence generator 61 inspects the status of the Bo and Do outputs to determine whether the data present on the output of gates 65 for the higher order bits can be used directly by loading it into and passing it through counter 73 or if the contents of counters 73 are to be separately incremented in the up or down direction depending upon the events occurring for the lower significant digit. Accordingly, a composite of the lower and higher order digits is presented to decoder 66 for conversion to acceptable levels for transfer to a seven segment LED display combination 67. The user can determine the angular position of the structure being measured by inspecting display 67 and/or the data reflecting this angular position can be coupled to other using circuitry such as for data acquisition or position controlling mechanisms or the like.

One example of an excess-3 Gray code implementation for Ao-Do shown in FIG. 5 has been found to function satisfactorily but it will be readily apparent that the invention can be utilized for other codes or multiple-bit group data sources or even with other arrangements of the Gray code. For instance, sensitivity to boundary skew or misalignment can be enhanced by arranging the Ao-Do tracks so that each sequential track boundary is reflected by transitions in the cells of neighboring tracks with the +/− track being removed from within the Ao-Do zone. Furthermore, it should be recognized that the bit patterns illustrated in FIG. 5 are symmetrical about the zero mil radial track when the invention is used as a positive and negative vertical angle measuring instrument. That is, the pattern shown for positive mil segments from zero and progressing to the right is duplicated for the negative mil segments progressing to the left from the zero mil radial track, the only difference being the X or +/− track. FIG. 5 shows an excess-3 Gray code having a positive and a negative code portion whose $A_n$-$B_n$ ($n$ determining the power of 10) are symmetricl about zero. Of course, the +/− band is not symmetrical since it provides a designation of sign to the counter or digital display. Therefore, the least significant digit transitions in the negative portions (not shown in FIG. 5) would first occur at −9 to −10 and would operate in the same manner as the transitions in the positive side with the only difference being the negative sign so that transition ambiguities would be reference controlled by the least significant digit based on its increase or decrease in negative magnitudes. However, use of the invention for a 360° disc would employ a continuous progression from 0° to 359° and resolution of up to one minute is possible for such a system.

Although the present invention has been disclosed with particularity relative to the foregoing detailed description of the exemplary preferred embodiments, various changes, modifications, additions and applications other than those specifically mentioned herein will be readily apparent to those having normal skill in the art without departing from the spirit of this invention.

What is claimed is:

1. In a system having an input of a group of least significant bits and one or more groups of higher significant bits which change state at one transition point of one of the least significant bits, apparatus for producing output date correlated to the system input free of transition ambiguities comprising:
    system output means;
    means for coupling information correlated to the least significant bits to said system output means;
    means for storing information correlated to the higher significant bits and for transferring said stored information to said system output means;
    control circuit means responsive to the status of the least significant bits for controlling the information input into said storage means, said control circuit means generating a control signal in the presence of a first zone around the transition point and a transition reflecting signal in the presence of the transition point, said control circuit generating a load signal in the presence of a second zone removed from said first zone, said load signal operative to input higher significant bit correlated information into said storage means; and
    commutation circuit means associated with said control circuit means and responsive to said control signal for disabling said storage means from receiving said higher significant bit correlated information and responsive to said transition reflecting signal for altering the information in said storage means.

2. Apparatus in accordance with claim 1 wherein said control circuit means includes means for producing a first transition reflecting signal when the transition point is passed in a first direction and a second transition reflecting signal when the transition point is passed in an opposite direction, said commutation circuit means including means operable in the presence of said control signal for incrementing said stored information in response to said first transition reflecting signal and for decrementing said stored information in response to said second transition reflecting signal.

3. Apparatus in accordance with claim 1 which includes an enabling signal means operable during a predetermined time span after initial start-up of the system for preventing said storage means from transfering any said information until after receiving at least one said higher significant bit correlated information, said enabling signal means coupled to said least significant bits in a region not corresponding to said transition point of said higher significant bits.

4. Apparatus in accordance with claim 1 wherein said system output means includes a plurality of display devices connected for receiving respective outputs from said coupling means and said storing means for providing separate displays correlated to respective groups of system input bits.

5. In a system having an input of a plurality of groups of binary bits with a first of the groups corresponding to a least significant order of information and one or more of the other groups corresponding to higher significant orders of information correlated to the least significant order group and wherein a first of the least significant bits changes binary state at points where at least one of the higher ordered groups changes binary state and a second of the least significant bits has a constant first binary state at the first bit binary state change point and a constant second binary state between the first bit binary state change points, apparatus for producing accurate output information comprising:
    a plurality of output terminals,
    means responsive to the first group of binary bits for coupling the information thereof to said output terminals,
    counter circuit means having an output relfective of the contents thereof and operable in a first mode for conforming said contents in response to signals at a first input thereof and in a second mode for changing the state of said contents in response to signals at a second input thereof,
    means responsive to the higher significant order group bits for coupling the information thereof to said counter circuit means first input,
    commutation means responsive to the first and second binary states of the second least significant bit for enabling said counter circuit means for said second and first mode operation, respectively,
    control means responsive to a binary state change of the first least significant bit for introducing an input signal to said counter circuit means second input, and
    means for connecting said counter circuit means output to said output terminals.

6. Apparatus in accordance with claim 5 wherein said control means includes means introducing a first input signal to said counter circuit means whenever the first least significant bit changes binary state in a first direction and a second input signal whenever the first least significant bit changes binary state in an opposite direction, said counter circuit means in said second mode responding to said first and second input signals by respectively incrementing and decrementing said contents thereof.

7. Apparatus in accordance with claim 5 which includes a source of periodic pulses, storage means responsive to said periodic pulses for receiving and storing the binary bit groups, and connecting circuit means for introducing the content of said storage means to the input of said coupling means and to said counter circuit means first input.

8. Apparatus in accordance with claim 7 wherein said connecting circuit means includes gate circuit means, said apparatus further including means operable in response to initial start-up of the system for introducing an enabling signal to said gate circuit means a predetermined time period thereafter for allowing said storage means to store at least one set of groups of binary bits during a period that the second least significant bit it in the second binary state.

9. Apparatus in accordance with claim 8 wherein said commutation means and said control means are inoperative until enabled by said initial start-up enabling signal, said enabling signal coupled to said least significant bits in a region removed from the transition points of said higher order groups.

10. Apparatus in accordance with claim 5 which includes a plurality of display devices connected to respective groups of said plurality of output terminals for providing indications of information corresponding to the groups of binary bits at the system input.

11. Apparatus in accordance with claim 10 which includes a source of operating power connected to energize said apparatus, means for detecting that the operating power from said source is below an acceptable level, and means responsive to said detecting means for causing said display devices to reflect the unacceptable power level condition.

12. A system for providing accurate information concerning the angular displacement of a body relative to a reference line comprising:
a disc mounted for accommodating rotary motion thereof relative to the body and having a plurality of radial tracks each having a plurality of groups of cells with said cells containing coded information corresponding to angular displacement from the reference line, said groups in each track including a first group having bits corresponding to a least significant digit with a first bit of said first group changing binary state at a transition boundary and a second bit of said first group having a first binary state for a zone around said transition boundary and a second binary state outside said zone, at least one of the other said groups having cells corresponding to a higher significant digit with the binary state of one cell thereof changing at said transition boundary,
a plurality of means fixed relative to the body for sensing the binary state of said cells of each said track,
a plurality of data latches connected to receive the outputs of respective said sensing means,
a plurality of gate circuits,
means interconnecting said data latch outputs to respective said gate circuits,
a source of repetitively cycling sequential pulses, said data latches being responsive to a first said pulse for storing the outputs of said sensing means,
timing circuit means responsive to the initial said first pulse after start-up of the system for producing a continuous output signal a predetermined time thereafter for enabling said plurality of gate circuits,
commutation circuit means coupled for receiving the outputs of said data latches corresponding to the binary state of said first and second least significant bits and for producing first control signals outside of said zone, said commutation circuit being responsive to a second said sequential pulse for producing second control signals in the presence of said zone and the change in binary state of said least significant group first bit,
counter circuit means having a first input coupled to the outputs of said gate circuits corresponding to said higher significant bits and a second input coupled to said commutation circuit means control signals, said counter circuit means responding to said first control signal by conforming the contents thereof to said first counter circuit means input and to said second control signals by ignoring said first input thereof and by changing the contents thereof when said first bit binary state changes, and
output circuit means interconnected for receiving said gate circuit means outputs corresponding to said least significant group and the output of said counter circuit means.

13. A system in accordance with claim 12 wherein said counter circuit means includes an up/down counter, said commutation circuit means including means detecting the direction of binary state changes of said least significant digit first bit for producing an up count for said second control signal for a first said state change direction and a down count for said second control signal for the opposite said direction, said up/down counter responding to said up and down count second control signals by respectively incrementing and decrementing the contents thereof.

14. A system in accordance with claim 13 wherein said disc is coded in excess-3 Gray code, said up/down counter is a binary up/down counter, and said data latch to gate circuit interconnecting means includes an excess-3 Gray code to binary code converter circuit.

15. A system in accordance with claim 14 wherein said commutation circuit direction detecting means includes a latch circuit, means responsive to said second sequential pulse for comparing said latch circuit state with the state of said least significant digit first bit, and means responsive to a third said sequential pulse for conforming the state of said latch circuit to the current status of said least significant digit first bit.

16. A system in accordance with claim 12 wherein said timing circuit means produces said continuous output signal only after the concurrence of a first said sequential pulse and a signal from said sensing means indicating said zone is not present.

17. A system in accordance with claim 16 which includes means responsive to initial system start-up for causing sufficient relative motion between said disc and said sensing means for insuring that said first group bits will occur outside of said zone.

18. A system in accordance with claim 12 wherein said disc cells are coded as transparent or opaque areas, said sensing means includes a plurality of light emitting devices arrayed in conformity to said radial tracks on one side of said disc and a plurality of light sensitive devices arrayed on the opposite side of said disc for receiving light originating from respective said emitting devices and passing through said disc for producing electrical output signals corresponding to said received light.

19. A system in accordance with claim 18 wherein said sequential pulse source produces a low duty cycle enabling pulse for energizing said light emitting devices, said first sequential pulse from said source being produced subsequent to the initiation of but concurrently with said enabling pulse for insuring that said light sensitive device electrical output signals have been stabilized.

* * * * *